(12) United States Patent
Hu et al.

(10) Patent No.: US 11,183,458 B2
(45) Date of Patent: Nov. 23, 2021

(54) INTEGRATED CIRCUIT PACKAGING STRUCTURE AND METHOD

(71) Applicant: Shenzhen Xiuyuan Electronic Technology Co., Ltd., Guangdong (CN)

(72) Inventors: Chuan Hu, Chandler, AZ (US); Junjun Liu, Albany, NY (US); Yuejin Guo, Phoenix, AZ (US); Edward Rudolph Prack, Phoenix, AZ (US)

(73) Assignee: Shenzhen Xiuyuan Electronic Technology Co., Ltd, Guangdong (CN)

( * ) Notice: Subject to any disclaimer, the term of this patent is extended or adjusted under 35 U.S.C. 154(b) by 0 days.

(21) Appl. No.: 16/464,896

(22) PCT Filed: Nov. 30, 2016

(86) PCT No.: PCT/CN2016/107834
§ 371 (c)(1),
(2) Date: May 29, 2019

(87) PCT Pub. No.: WO2018/098650
PCT Pub. Date: Jun. 7, 2018

(65) Prior Publication Data
US 2019/0287909 A1 Sep. 19, 2019

(51) Int. Cl.
*H01L 23/538* (2006.01)
*H01L 21/48* (2006.01)
(Continued)

(52) U.S. Cl.
CPC ...... *H01L 23/5386* (2013.01); *H01L 21/4853* (2013.01); *H01L 21/563* (2013.01);
(Continued)

(58) Field of Classification Search
CPC ............. H01L 23/5386; H01L 23/5381; H01L 23/5382; H01L 21/4853; H01L 21/485;
(Continued)

(56) References Cited

U.S. PATENT DOCUMENTS

| 7,589,426 B2 * | 9/2009 | Jiang | H01L 23/49816 257/780 |
| 8,946,900 B2 * | 2/2015 | Qian | H01L 23/49827 257/762 |

(Continued)

FOREIGN PATENT DOCUMENTS

| CN | 1835229 A | 9/2006 |
| CN | 104471708 A | 3/2015 |

(Continued)

OTHER PUBLICATIONS

May 31, 2017—(CN) International Search Report—App PCT/CN2016/107834—Eng Tran.

(Continued)

*Primary Examiner* — David A Zarneke
(74) *Attorney, Agent, or Firm* — Banner & Witcoff, Ltd.

(57) ABSTRACT

An integrated circuit packaging structure and method are provided, the integrated circuit packaging structure includes: a substrate, the substrate being provided with a circuit layer and fine wiring; a chip, the chip being provided with a fine pin and a chip pin; the substrate is provided with at least two of said chips, a chip pin of at least one of said chips being electrically connected to the circuit layer; an insulation patch, the fine wiring being provided on the insulation patch, while the fine pin of the chip is electrically connected to the fine wiring, at least two of said chips being directly electrically connected by means of the fine wiring.

7 Claims, 4 Drawing Sheets

(51) Int. Cl.

| | |
|---|---|
| *H01L 21/56* | (2006.01) |
| *H01L 23/31* | (2006.01) |
| *H01L 23/367* | (2006.01) |
| *H01L 23/552* | (2006.01) |
| *H01L 25/065* | (2006.01) |
| *H01L 25/11* | (2006.01) |
| *H01L 25/07* | (2006.01) |
| *H01L 25/075* | (2006.01) |

(52) U.S. Cl.
CPC ........ *H01L 23/3157* (2013.01); *H01L 23/367* (2013.01); *H01L 23/538* (2013.01); *H01L 23/5387* (2013.01); *H01L 23/552* (2013.01); H01L 25/0655 (2013.01); H01L 25/072 (2013.01); H01L 25/0753 (2013.01); H01L 25/115 (2013.01); H01L 2224/83851 (2013.01)

(58) Field of Classification Search
CPC ............... H01L 25/0655; H01L 25/072; H01L 25/0753; H01L 25/115; H01L 2224/83851
See application file for complete search history.

(56) References Cited

U.S. PATENT DOCUMENTS

| | | | | |
|---|---|---|---|---|
| 9,059,179 | B2* | 6/2015 | Karikalan | H01L 24/73 |
| 9,070,644 | B2* | 6/2015 | Chen | H01L 23/528 |
| 9,236,366 | B2* | 1/2016 | Roy | H01L 21/4857 |
| 9,595,496 | B2* | 3/2017 | Lee | H01L 23/5385 |
| 9,646,894 | B2* | 5/2017 | Chen | H01L 25/18 |
| 9,997,446 | B2* | 6/2018 | Kim | H01L 24/14 |
| 10,037,946 | B2* | 7/2018 | Hu | H01L 25/18 |
| 10,510,721 | B2* | 12/2019 | Bhagavat | H01L 23/49822 |
| 2004/0109282 | A1* | 6/2004 | Li | H01L 24/29 361/820 |
| 2005/0098885 | A1* | 5/2005 | Aoyagi | H01L 21/563 257/738 |
| 2008/0138932 | A1* | 6/2008 | Hatano | H01L 23/5389 438/107 |
| 2013/0200511 | A1 | 8/2013 | Banijamali | |
| 2014/0131854 | A1* | 5/2014 | Hawk | H01L 24/06 257/737 |
| 2014/0264337 | A1* | 9/2014 | Chen | H01L 22/34 257/48 |
| 2014/0264791 | A1* | 9/2014 | Manusharow | H01L 25/0655 257/666 |
| 2020/0227377 | A1* | 7/2020 | Liff | H01L 23/5385 |

FOREIGN PATENT DOCUMENTS

| | | |
|---|---|---|
| WO | 2013119309 A1 | 8/2013 |
| WO | 2016073790 A1 | 5/2016 |

OTHER PUBLICATIONS

May 3, 20171—(CN) Written Opinion of the International Search Authority—App PCT/CN2016/107834.

* cited by examiner

INTEGRATED CIRCUIT PACKAGING STRUCTURE AND METHOD

CROSS-REFERENCE TO RELATED APPLICATION

The present application is a U.S. National Phase Application under 35 U.S.C. § 371 and claims priority to International Application No. PCT/CN2016/107834 filed Nov. 30, 2016, the content of which is hereby incorporated by reference in its entirety.

TECHNICAL FIELD

The disclosure belongs to the field of electronics, and in particular relates to an integrated circuit packaging structure and method.

BACKGROUND ART

In a conventional integrated circuit system, chips are separately packaged and then mounted on a circuit board together with other electronic devices. Data communication between chips and circuit connections between the chips and other electronic devices should be achieved by means of chip pins, electronics device pins and circuitry inside the circuit board. It is indispensable to reserve sufficient space between the chips as well as between other electronic devices and the chips, therefore the geometric dimension of the entire system is constrained and cannot be sufficiently miniaturized. Since it is required that each chip after being separately packaged is usually required to be connected to a circuit port of a substrate by bonding or flip-chip, and then connected to the circuit board. The materials are used in a large amount, the process is complicated, and the production cost is high. Moreover, various thermomechanical stress problems at the interface of each material are prone to be induced due to the use of a large number of materials having different characteristics.

SUMMARY

Based on this, the present disclosure overcomes the deficiencies of the prior art and provides an integrated circuit packaging structure and method for improving data transmission bandwidth and speed between chips and improving system performance.

Its technical solutions are as follows:

An integrated circuit packaging structure comprising: a substrate provided with a circuit layer and fine wirings (connection lines); chips each provided with fine pin(s) and chip pin(s); wherein the substrate is provided with at least two of said chips and the chip pin(s) of at least one of the chips is electrically connected to the circuit layer, the circuit layer is provided with an insulation patch, and the insulation patch is provided with fine wiring(s), and the fine pin(s) of each chip is electrically connected to the fine wiring(s) such that the at least two chips are directly electrically connected by means of the fine wiring(s).

In one embodiment, a connection medium is provided with between the chip pin(s) and the fine pin(s), wherein the connection medium includes an insulating medium, and at least one fine conductive path (channel) distributed in the insulating medium, and the fine pins are electrically connected to each other by means of the fine conductive path.

In one embodiment, the fine wirings have a width of from 0.1 micrometer to 2 micrometers, or from 1 micrometer to 5 micrometers.

In one embodiment, a heat sink (heat dissipating device) is provided on each chip.

In one embodiment, an encapsulation layer is further included, wherein the chips, the fine wirings, and the insulation patch are located between the encapsulation layer and the substrate, and the chips and the insulation patch on the substrate is packaged by the encapsulation layer.

In one embodiment, the substrate is a flexible circuit board, or the substrate comprises at least two layers of flexible circuit boards arranged in a stacked manner.

In one embodiment, the chip is located on a top surface of the substrate, an additional circuit layer is provided with on a bottom surface of the substrate and/or inside the substrate, and the additional circuit layer is provided with additional pins. The substrate is provided with additional through holes, the additional through holes are connected to the additional pins respectively, and a first opening of each additional through hole is connected to the respective chip pin, and a second opening of the additional through hole is an operation window. An additional conductive layer is provided in each additional through hole, wherein the additional conductive layer electrically connects the respective chip pin and the respective additional pin.

In one embodiment, the chip pins are at least two, the conductive layers are at least two corresponding to the chip pins, and the bottom surface of the substrate is provided with an external port, and the external port is electrically connected to at least one of the conductive layers.

In one embodiment, the substrate is provided with connection through holes, wherein the connection through holes are connected with circuit pins respectively, and a first opening of each connection through hole is connected with the respective chip pin, a second opening of the connection through hole is an operation window, and the connection through hole is provided therein with a conductive layer, wherein the conductive layer electrically connects the respective chip pin and the respective circuit pin.

In one embodiment, an area occupied by the insulation patch is smaller than an area occupied by the circuit layer.

An integrated circuit packaging method includes: providing a circuit layer on a substrate, providing an insulation patch on the substrate, forming fine wirings on the insulation patch, providing at least two chips are on the substrate, wherein each chip is provided with fine pin(s) and chip pin(s), electrically connecting the chip pin(s) to the circuit layer, and electrically connecting the fine pin(s) the respective fine wiring(s), so that the at least two chips are directly connected by means of the fine wirings.

In one embodiment, the method includes: making the circuit layer provided with circuit pins, making the substrate provided with connection through holes, wherein the connection through holes are connected with the circuit pins respectively; placing the chips on the top surface of the substrate, wherein the chip pin of each chip is connected with a first opening of the respective connection through hole; forming a conductive layer in the connection through hole by means of a second opening of the connection through hole, so that the conductive layer electrically connects the chip pin to the respective circuit pin; or making the circuit layer provided with circuit pins, placing the chips on the top surface of the substrate, so that the chip pin(s) of each chip faces the substrate, forming connection through holes on the substrate, connecting the connection through holes with the circuit pins respectively, connecting the first opening of each connection through hole with the respective chip pin, forming the conductive layer in the connection through hole by means of the second opening forms of the connection through hole, such that the conductive layer electrically connects the chip pin to the respective circuit pin.

In one embodiment, the method includes: providing an additional circuit layer on a bottom surface of the substrate and/or inside the substrate, wherein the additional circuit layer is provided with additional pins, making the substrate provided is with additional through holes, and connecting the additional through holes with the additional pins respectively; placing the chips on the top surface of the substrate and connecting the chip pin(s) of each chip with a first opening of the respective additional through hole; forming an additional conductive layer in the additional through hole by means of a second opening of the additional through hole such that the additional conductive layer electrically connects the chip pin(s) to the respective additional pin; or making the additional circuit layer provided with additional pins, placing the chips on the top surface of the substrate such that the chip pin(s) of each chip faces the substrate, forming additional through holes are on the substrate, connecting the additional through holes with the additional pins respectively, connecting the first opening of each additional through hole with the respective chip pin, and forming a conductive layer in the additional through hole by means of the second opening of the additional through hole, so that the conductive layer electrically connects the chip pin and the respective circuit pin.

In one embodiment, the method further includes: providing an encapsulation layer with the substrate, wherein the chips, the insulation patch, and the fine pins are located between the encapsulation layer and the substrate, and the chips, the insulation patch, and the fine pins are encapsulated by the encapsulation layer.

In one embodiment, a conductor layer is provided with on the substrate, the insulation patch is provided with on the conductor layer, and a conductor film is provided with on the insulation patch, wherein the conductor layer has a thickness greater than a thickness of the conductor film, a (etchant) resist is provided with on the conductor layer and the conductor film, the resist is provided with a wiring pattern, the conductor layer is etched into the circuit layer according to the wiring pattern by using a chemical etching method, and the conductor film is etched into the fine wirings.

In one embodiment, the circuit layer is provided with on the substrate, the insulation patch is provided with on the circuit layer, and a photoresist is provided with on the insulation patch, and wiring grooves are formed on the photoresist and the fine wirings are grown by crystal growth in the wiring grooves.

In one embodiment, an insulation patch is formed on the carrier, the fine wirings are formed on the insulation patch, and the insulation patch is transferred to the substrate along with the fine wirings, and the fine wirings are fixed to the substrate.

In one embodiment, a connection medium is provided with between the chips and the fine pins, the connection medium includes an insulating medium, and at least one fine conductive particle distributed in the insulating medium; wherein a spacing between each chip pin and the respective fine pin is less than or equal to a height of the at least one fine conductive particle, the chips are placed on the substrate, and one end of each fine conductive particle is electrically connected to the respective fine pin, and the other end of the fine conductive particle is electrically connected to the respective fine wiring; a spacing between each chip pin and the respective fine wiring is greater than the height of the at least one fine conductive particle, and the chip pins and the fine wirings cannot be electrically connected by means of the at least one fine conductive particle.

The beneficial effects of the disclosure are:

1. The integrated circuit packaging structure comprises: a substrate provided with a circuit layer and fine wirings; chips each provided with fine pin(s) and chip pin(s); the substrate is provided with at least two chips, the chip pin of at least one chip is electrically connected to the circuit layer, the circuit layer is provided with an insulation patch, the insulation patch is provided with fine wirings, the fine pin(s) of each chip is electrically connected with the respective fine wiring, and at least two chips are directly electrically connected by means of the fine wirings.

The chips are electrically connected to the circuit layer, and the chips may communicate or exchange energy with other electronic devices connected on the circuit layer, and the chips are directly connected with each other by fine wirings to reduce interference from other electronic devices connected on the circuit layer. Moreover, the fine wirings are tiny, and a larger number of wirings may be formed in the same space, which can provide a data communication capability with wider bandwidth, and more data channels may be obtained between the chips, while the transmission speed is fast and the bandwidth is wide. The insulation patch isolates the fine wirings from the circuit layer to prevent the circuit layer from interfering with the fine wirings. For the communication between two chips requiring high speed and wide bandwidth, the method with fine wirings is adopted to improve the transmission performance between the chips, and communications between two chips that do not require high speed or wide bandwidth and communications between other devices can be implemented by connection through the circuit layer to reduce production costs. On the other hand, by adopting a method of providing an insulation patch, processes of forming the circuit layer on the substrate, providing an insulation patch and fine wirings at a predetermined position, and the like, may be performed in batch flow to reduce the production costs.

2. A connection medium is provided with between the fine pins and the fine wirings, the connection medium includes an insulating medium, and at least one fine conductive path distributed in the insulating medium, wherein the insulating medium separates the chips from the fine pins, only where the fine pins and the fine wirings are placed, to avoid interference, and the fine pins are electrically connected to other fine pins by means of the fine conductive paths. The form of the fine conductive path includes, but is not limited to, conductive particles or solder bumps are provided in the insulating medium to form the fine conductive paths; the insulating medium is provided with fine conductive holes, and a conductive material layer is provided within the fine conductive holes to form the fine conductive paths; conductive bumps are formed on the fine wirings on the chips and/or fine wirings on the insulation patch, and the conductive bumps constitute fine conductive paths.

3. The fine wirings have a width of from 0.1 micrometer to 2 micrometers, or from 1 micrometer to 5 micrometers. The width of the fine wiring(s) connection refers to the side length of the fine wirings' cross section on the insulation patch. The width of the fine wirings is smaller than the width of the wirings of the circuit layer. The smaller the width of the fine wiring connection, the larger achievable density of wirings, and the larger the number of communication wirings in a space of the same size, which is conducive to the data transmission speed and bandwidth.

4. A heat sink is provided with on each chip. Since fine wirings of high-bandwidth and high-speed are used for the communication between the chips, the chips have a high computing speed and a large heat generation as well, and a heat sink is added to each chip to facilitate heat dissipation of the chip and to ensure work performance. On the other hand, the insulation patch may increase the difficulty of heat dissipation from the chip to the substrate (such problem does not exist if a material with high thermal conductivity is used), which increases the thermal impedance, and adding a heat sink on the chip (on the side away from the substrate) facilitates the heat dissipation of the chip from the back side, with the heat dissipation not only relying on the heat dissipation channels from the substrate, so that the chip can work normally at a higher computing speed. This structural design, on the one hand, improves the data communication bandwidth and speed between the chips, on the other hand, ensures that the chip can work normally at a higher computing speed, which can greatly improves the overall computing performance of the system.

5. The integrated circuit packaging structure further includes an encapsulation layer, wherein the chips, the fine wirings, and the insulation patch are located between the encapsulation layer and the substrate, and the encapsulation layer packages the chip and the insulation patch on the substrate. The encapsulation layer can protect the chips, the insulation patch, and the fine wirings from damages, and reduce the influence and interference of external environmental factors on the performance of the chips to ensure the working performance of the chips. In the case of presence of more subsequent processes, the cured encapsulation layer also provides a flat surface and performance of mechanical support, enabling the subsequent production process to be performed on the substrate after flipping the system as a whole.

6. The substrate is a flexible circuit board, or the substrate comprises at least two layers of flexible circuit boards arranged in a stacked manner. The use of a multiple layers of circuit boards and its embedded multiple layers of circuit layers can provide more possibilities of wirings, which improves the performances of the chip, and use of a flexible and thin circuit boards reduces the overall weight, volume and thickness of the system. By adopting the integrated circuit packaging structure and method of the present disclosure, the system is enabled to have sufficient flexibility after package and integration, and is applicable to wearable products. Moreover, by means of the insulation patch, the thickness of the fine wirings themselves is very small, and the insulation patch does not require a very large thickness can be insulated as long as the fine wirings are insulated from the circuit layer, so that the flexible circuit boards are still thin with flexibility after the integration of the chips. The thickness of the fine wirings refers to the side length of the cross section of the fine wirings which is perpendicular to the insulation patch, and the thickness of the insulation patch refers to the side length of the cross section of the insulation patch which is perpendicular to the substrate.

7. The chips are located on the top surface of the substrate, and an additional circuit layer is provided on the bottom surface of the substrate and/or inside the substrate. The additional circuit layer is provided with additional pins, the substrate is provided with additional through holes, wherein the additional through holes are connected with the additional pins respectively, a first opening of each additional through hole is connected with the respective chip pin, the second opening of the additional through hole is an operation window, the additional through hole is provided therein with an additional conductive layer, and the additional conductive layer electrically connects the chip pin and the respective additional pin.

The additional circuit layer is provided with the additional pins, and an additional circuit layer may be formed on the substrate in advance, or the additional circuit layer may be formed on the substrate when the integrated circuit is packaged, and the additional pins may be connection portions directly led out from the additional circuit layer, and they may also be extension pins electrically connected to the connection portions respectively, as long as electrical connection with the additional circuit layer can be realized by means of the additional pins. The chips are placed on the substrate, and the chips may be fixed on the substrate or may not be fixed. The chips are provided opposite to the substrate, and each chip is provided with chip(s) pin facing one side of the substrate, and the chip pin(s) of the chip includes but is not limited to a connection portion led out from inside the chip, or an extension pin electrically connected to the connection portion, as long as electrically connection with the chip can be realized by means of the chip pin(s). Additional connection through holes are formed on the substrate such that the chip pin is connected to a first opening of the respective additional through hole, and an additional conductive layer is formed in the additional through hole by means of the second opening of the additional through hole, wherein the additional conductive layer electrically connects the chip pin to the respective additional pin; the chip pin(s) is located on the top surface of the substrate, and the chip may be electrically connected with the additional circuit layer from the bottom surface of the substrate via the second opening of the additional through hole to prevent the chip from blocking the chip pin(s) from above;

wherein, the additional through hole is connected to the respective chip pin, and the additional pin is at least partially located near the first opening of the additional through hole, or extends deep into the additional through hole, so that the additional conductive layer can be electrically connected to the chip pin; the additional pin is connected to the additional connection through hole, the additional pin is at least partially located near the first opening of the additional through hole, or near the second opening, or near an inner wall of the additional through hole, such that the additional conductive layer can be electrically connected to the additional pin. The chips may be chips or electronic devices (including but not limited to resistors, capacitors) or other electronic devices (including but not limited to antennas). The chips may be fixed to the substrate by additional through holes and additional conductive layers, or the chip may be fixed to the substrate by other means (including, but not limited to, bonding, molding plastic packaging).

In this way, the cost of the integrated circuit package can be reduced, and the packaging time can be saved. Further, multiple chips may be simultaneously mounted on a large substrate with a large area, and the batch processing on the large substrate further reduces the cost and saves the packaging time. Moreover, the thickness of the whole system composed of the substrate and the chips can be reduced, and even no gap is required to be reserved between the substrate and the chips (in principle, no gap requires to be reserved, but other materials may be provided between the substrate and the chips as needed); a process that does not require heat welding may be selected for forming conductive additional through holes, thus avoiding damage to the mechanism and performance of ultra-thin chips and flexible circuit boards caused by various thermo-mechanical stress distributions during high-temperature thermal cycling. This is very helpful for packaging processes using ultra-thin, flexible boards. On the other hand, in the conventional packaging technology of wire bonding, wires are used to realize electrical connection between the chips and the circuit layer on the substrate, and the wires are to be avoided from each other, so that the space occupied is large, and the present disclosure realizes the electrical connection between the chips and the additional circuit layer by forming additional through holes on the substrate, and the additional conductive layers are provided within the additional through holes, which does not occupy extra space, and can reduce the overall volume after the package, in particular, the thin and light property can be maintained the ultra-thin circuit boards, the flexibility can be maintained for flexible circuit boards.

Preferably, the method includes but is not limited to the following two manufacturing methods:

(1) providing an additional circuit layer on the bottom surface of the substrate and/or the inside the substrate, the additional circuit layer is provided with additional pins, the substrate is provided with additional through holes, and the additional through holes are connected to the additional pins respectively; the chips are placed on the top surface of the substrate, connecting the chip pin(s) of each chip with the first opening of the respective additional through hole; forming an additional conductive layer in the additional through hole by means of the second opening of the additional through hole, causing the additional conductive layer to electrically connect the chip pin to the respective additional pins; or (2), making the additional circuit layer provided with additional pins, placing the chips on the top surface of the substrate, with the chip pin(s) of each chip oriented toward the substrate, forming additional through holes on the substrate, connecting the additional through holes with the additional pins respectively, connecting the first opening of each additional through hole with the respective chip pin, forming the conductive layer in the additional through hole by means of the second opening of the additional through hole, and causing the conductive layer to electrically connect the chip pin to the respective circuit pin.

8. The chip pins are at least two, and the conductive layers are at least two corresponding to the chip pins. The bottom surface of the substrate is provided with an external port, wherein the external port is electrically connected to at least one of the conductive layers. The external port may be connected to another electronic device to extend the function of the entire integrated circuit. The external port may also be used to be connected with a power supply, and the chips are directly supplied by the power supply.

9. The substrate is provided with connection through holes, wherein the connection through holes are connected with the circuit pins respectively, and the first opening of each connection through hole is connected with the respective chip pin, the second opening of the connection through hole is an operation window, and the connection through hole is provided therein with a conductive layer, and the conductive layer electrically connects the chip pin to the respective circuit pin.

The circuit layer is provided with circuit pins, and the circuit layer may be formed on the substrate in advance, or the circuit layer may be formed on the substrate when the integrated circuit is packaged. The circuit pins may be connection portions directly led out from the circuit layer, or may be extension pins electrically connected to the connection portions, as long as electrically connection with the circuit layer can be achieved by means of the circuit pins.

The chips are placed on the substrate, and the chips may be fixed on the substrate or may not be fixed. The chips are provided opposite to the substrate, and the chips are each provided with a chip pin facing one side of the substrate, and the chip pin(s) of the chip includes but is not limited to a connection portion led out from inside the chip, or an extension pin electrically connected to the connection portion, as long as electrically connection with the chip can be achieved by means of the chip pins. Connection through holes are formed on the substrate, the chip pin is connected with the first opening of the respective connection through hole, and a conductive layer is formed in the connection through hole by means of the second opening of the connection through hole. The conductive layer electrically connects the chip pin to the respective circuit pin; the chip pin(s) is located on a top surface of the substrate, and the chip(s) is electrically connected to the circuit layer from the bottom surface of the substrate via the second opening of the through hole, thereby preventing the chip from blocking the chip pins;

In the above, the connection through holes are connected with the chip pins, and each circuit pin is at least partially located near the first opening of the respective connection through hole or extends deep into the connection through hole, so that the conductive layer can be electrically connected to the chip pin; the circuit pin and the connection through hole are connected, the circuit pin is at least partially located near the first opening of the connection through hole, or near the second opening, or near the inner wall of the connection through hole, so that the conductive layer can be electrically connected to the circuit pin; the chips may be chips or electronic devices (including but not limited to resistors, capacitors) or other electronic devices (including but not limited to antennas). The chips may be fixed to the substrate by connection through holes and conductive layers, or the chips may be fixed to the substrate by other means (including, but not limited to bonding, molding plastic packaging).

In this way, the cost of the integrated circuit package can be reduced, and the packaging time can be saved. Further, multiple chips may be simultaneously mounted on a large substrate with a very large area, and the batch processing on the large substrate further reduces the cost and saves the packaging time. Moreover, the overall thickness of the substrate and the chip is reduced, and even no gap is required to be reserved between the substrate and the chips (in principle, no gap is required to be reserved, but other materials can be provided between the substrate and the chips as needed); no step of heat welding is required, especially for the packaging of ultra-thin substrates and flexible circuit boards, warpage and degradation of performance of the substrate at high temperatures are avoided. On the other hand, the conventional electronic package uses wires to realize electrical connection between the chips and the substrate circuit layer, and the wires occupy a large space. The present disclosure realizes the electrical connection between the chips and the circuit layer by forming connection through holes on the substrate, and the conductive layer is provided within the respective connection through hole, it does not occupy extra space, and the overall volume can be small after packaging. In particular, for ultra-thin circuit boards, the thin and light characteristics can be well maintained, and the flexible circuit boards can maintain their flexibility well.

Preferably, the method includes but is not limited to the following two manufacturing methods:

(1) The circuit layer is provided with circuit pins, the substrate is provided with connection through holes, wherein the connection through holes are connected with the circuit pins respectively; the chips are placed on the top surface of the substrate, so that the chip pin(s) of each chip are connected with the first opening of the respective connection through hole; forming a conductive layer in the connection through hole by means of the second opening connecting the through holes, so that the conductive layer electrically connects the chip pin with the respective circuit pin; or (2), the circuit layer is provided with circuit pins, the chips are placed on the top surface of the substrate, with the chip pins of the chip oriented toward the substrate, and the connection through holes are formed on the substrate, so that the connection through holes are connected with the circuit pins respectively, and the first opening of each connection through hole is connected with the respective chip pin, and a conductive layer is formed in the connection through hole by means of the second opening of the connection through hole, so that the conductive layer electrically connects the chip pin to the respective circuit pin.

10. The area occupied by the insulation patch is smaller than the area occupied by the circuit layer. The insulation patch and the fine wirings thereon constitute a fine wiring (connecting) area, and one or two or more fine wiring areas may be provided between two chips as needed, or one chip may be simultaneously electrically connected to two or more chips by means of two or more fine wiring areas; moreover, providing the fine wiring areas does not need to modify the original circuit layer, and the fine wiring areas are flexible and can be set as needed to reduce the cost.

11. The integrated circuit packaging method further includes: providing a conductor layer on the substrate, providing an insulation patch on the conductor layer, and providing a conductor film on the insulation patch, wherein the thickness of the conductor layer is greater than the thickness of the conductor film, and providing a resist on the conductor layer and the conductor film, the resist is provided with a wiring pattern, and the conductor layer is etched into a circuit layer by a chemical etching according to a wiring pattern, and the conductor film is etched into fine wirings. After the resist is simultaneously provided both on the conductor layer and the conductor film, chemical etching is simultaneously performed, and the circuit layer and the fine wirings are simultaneously formed according to the wiring pattern, thereby saving steps, improving efficiency, reducing production cost, moreover all circuit layers and conductor films on multiple substrates are simultaneously processed, which facilitates mass production and further reduces costs. Further, the thickness of the conductor film is equivalent to the thickness of the fine wirings, and the thickness of the conductor layer is equivalent to the thickness of the circuit layer, for example, when the thickness of the fine wirings are smaller than the thickness of the circuit layer, the thickness of the conductor film is smaller than the thickness of the conductor layer.

16. The circuit layer is provided on the substrate, the insulation patch is provided on the circuit layer, a photoresist is provided on the insulation patch, and wiring grooves are formed on the photoresist, and the conductor film is formed in the wiring grooves and on the surface of the photoresist using crystal growth. The photoresist is removed (stripped) to form the fine wirings in the wiring groove. Finer fine wirings can be obtained using crystal growth method to obtain more connection points, further improving the chip performance. The manner of crystal growth refers to the manner in which the conductive material is attached to the wiring groove to form fine wirings, including but not limited to: electroplating, sputtering, and vapor-deposition.

17. The insulation patch is formed on a carrier, fine wirings are formed on the insulation patch, and the insulation patch is transferred to the substrate along with the fine wirings, and the fine wirings are fixed to the substrate. This kind of manufacturing method can completely separate the manufacturing process of fine wirings and common wirings, and can avoid various difficulties in the production of connection of wirings with different line widths and line spacing. For example, in order to achieve different line precision, different resist film material and thickness may be needed; since it is necessary to implement a wider common wirings and finer fine wirings in one time of lithography and etching process, it is necessary to simultaneously photoetch lithographic patterns with different precisions at different heights, forming of common wirings also has to use more expensive lithographic equipment, which may also affect production efficiency. In addition, the method of separately manufacturing the insulation patch and then transferring and bonding it to the substrate does not require modification of the original circuit layer, and is convenient for transforming and upgrading the old integrated circuit. The fine wirings may be directly fixed to the substrate; or the fine wirings may be fixed to the insulation patch, the insulation patch may be fixed to the substrate, and the fine wirings may be fixed to the substrate by means of the insulation patch.

18. A connection medium is provided between the chips and the fine pins, wherein the connection medium includes an insulating medium, and at least one fine conductive particle distributed in the insulating medium; a spacing between each fine wiring and the respective fine pin is less than or equal to a height of the fine conductive particles, when the chips are placed on the substrate, one end of each fine conductive particle is electrically connected to the respective fine pin, the other end of the fine conductive particle is electrically connected to the respective fine wiring, and the fine pin and the fine wiring are electrically connected by the fine conductive particle; the chip pins and the fine wirings are connected by means of the fine conductive particles. The spacing between each chip pin and the respective fine wiring is greater than the height of the fine conductive particles, and the chip pins and the fine wirings cannot be electrically connected by the conductive particles.

When packaged, the insulating medium is provided between the chips and the fine pins, and the chip is pushed toward the insulation patch to reach a preset position. Since the spacing between each fine pin and the respective fine wiring is smaller than or equal to the height of the fine conductive particles, the fine conductive, the respective fine conductive particle is squeezed, one end thereof is electrically connected to the fine pin, and the other end is electrically connected to the fine wiring to electrically connect the fine pin and the fine wiring; the distance between each chip pin and the respective fine wiring is larger than that of the fine conductive particles. The fine conductive particle between the chip pin and the fine wiring cannot simultaneously contact the chip pin and the fine wiring, so the fine conductive particle cannot electrically connect the chip pin and the fine wiring.

A connection medium is also provided between the fine pin and the fine wiring. It also includes the following cases: except for the area near where the fine pin is located, the connection medium is also provided between other parts of the chip and the fine wirings. The spacing between the chip pins and the circuit layer is greater than the height of the fine conductive particles, and the fine conductive particles between the chip pins and the circuit layer cannot simultaneously contact the chip pins and the fine wirings, so the fine conductive particles cannot electrically connect the chip pins and the fine wirings.

It is also possible that the connection medium has a bonding property, and the chips may be bonded on the substrate. When the packaging, the insulating medium is provided with between the chips and the fine pins, and the chip is pushed toward the insulation patch to reach a preset position and the chip is bonded on the substrate. At the same time, the fine pins and the fine wirings are electrical connected, which is simple in manufacturing process and high in efficiency.

REFERENCE SIGNS

100—substrate, 101—conductor layer, 102—additional conductor layer, 110—circuit layer, 120—additional circuit layer, 130—connection through hole, 140—external port, 200—insulation patch, 201—conductor film, 210—fine wirings, 300—resist, 400—chip, 410—chip pin, 420—fine pin, 500—conductive layer, 610—fine conductive particle, 620—insulating medium.

DETAILED DESCRIPTION OF EMBODIMENTS

The present disclosure will be further described in detail below, but embodiments of the disclosure are not limited thereto.

Embodiment 1

Figure 1:
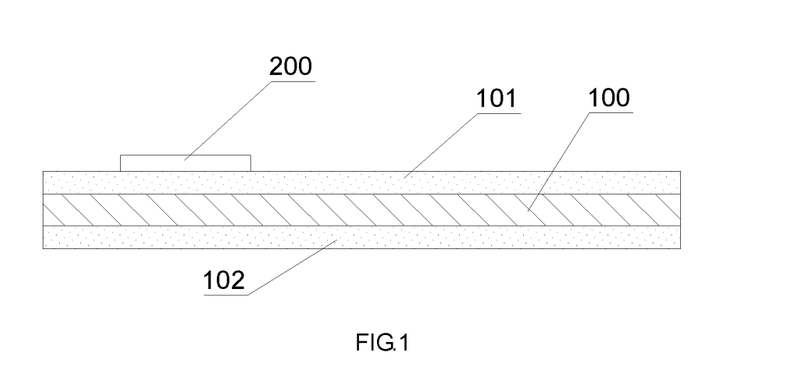
FIG. 1 is a first schematic diagram of an integrated circuit packaging structure and method according to an embodiment of the present disclosure.
Figure 2:
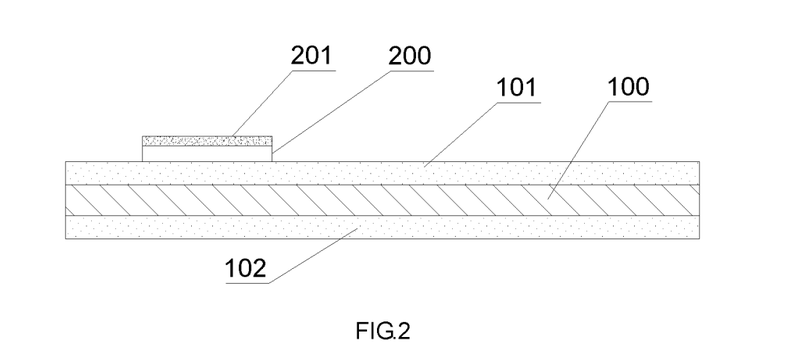
FIG. 2 is a second schematic diagram of an integrated circuit packaging structure and method according to an embodiment of the present disclosure.
Figure 3:
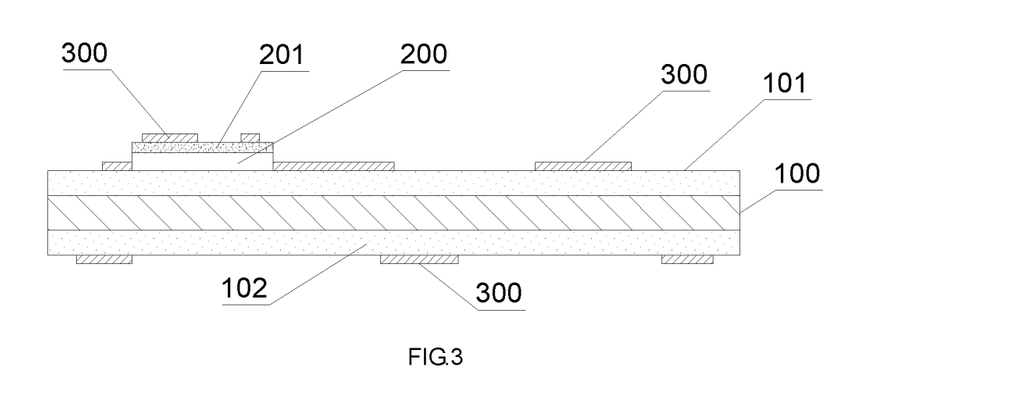
FIG. 3 is a third schematic diagram of an integrated circuit packaging structure and method according to an embodiment of the present disclosure.
Figure 4:
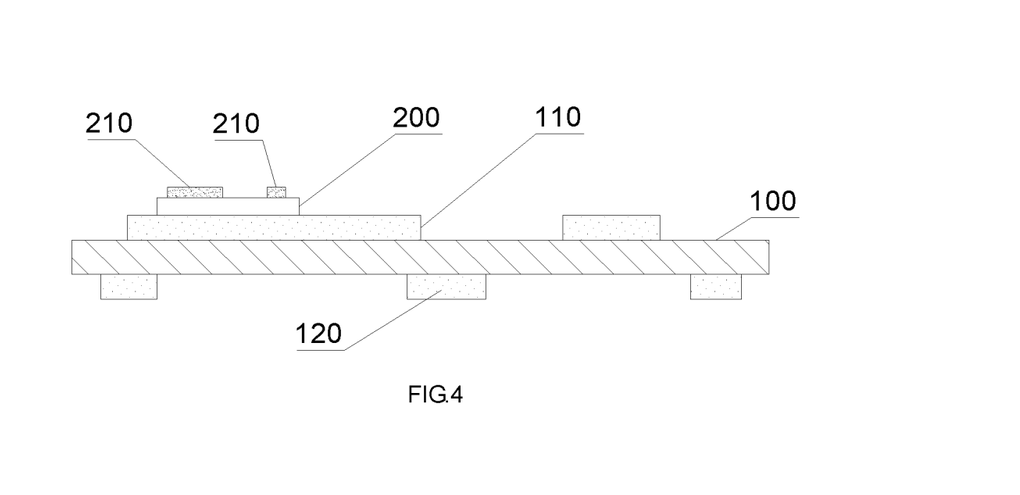
FIG. 4 is a fourth schematic diagram of an integrated circuit packaging structure and method according to an embodiment of the present disclosure.
Figure 5:
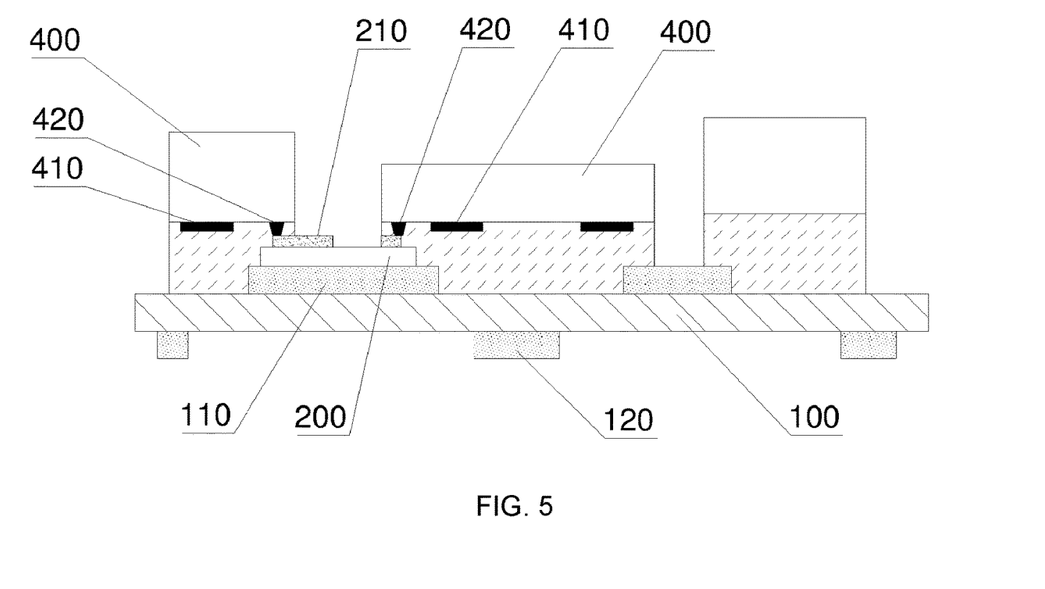
FIG. 5 is a fifth schematic diagram of an integrated circuit packaging structure and method according to an embodiment of the present disclosure.

As shown in FIG. 5, and referring to FIG. 1 to FIG. 4, the integrated circuit packaging structure includes: a substrate 100 provided with a circuit layer 110 and a fine wirings 210; chips 400 each provided with fine pin(s) 420 and chip pin(s) 410, wherein the substrate 100 is provided with at least two chips 400. The chip pin(s) 410 of at least one chip 400 is electrically connected to the circuit layer 110. The circuit layer 110 is provided thereon with an insulation patch 200, and the insulation patch 200 is provided thereon with fine wirings 210. The fine pin(s) 420 of the chip 400 is electrically connected to the respective fine wiring 210, and at least two chips 400 are directly electrically connected by means of the fine wirings 210. The chips 400 are electrically connected to the circuit layer 110. The chips 400 can communicate or exchange energy with other electronic devices connected on the circuit layer 110. The chips 400 are directly connected with each other by means of the fine wirings 210, and are not interfered by the circuit layer 110 and not interfered by other electronic devices connected on the circuit layer 110, and the fine wirings 210 are tiny, thus more data transmission channels can be obtained between the chips 400, resulting in a fast transmission speed and wide bandwidth. The insulation patch 200 insulates the fine wirings 210 from the circuit layer 110 to prevent the circuit layer 110 from interfering with the fine wirings 210. For communications between the two chips 400 requiring high speed and wide bandwidth, by using the fine wirings 210, the transmission performance between the chips 400 is improved, and for communications between the two chips 400 which do not require high speed or wide bandwidth, communication can be achieved by means of the circuit layer 110 to reduce the manufacturing cost. On the other hand, by providing the insulation patch 200, each circuit layer 110 can be simultaneously formed, and the insulation patch 200 and the fine wirings 210 may be simultaneously provided at predetermined positions, thus batch flow can be performed to reduce the production cost.

As shown in FIG. 5, each fine pin 420 is provided near an edge of the respective chip 400, and the insulation patch 200 and the fine wirings 210 are provided across the two chips 400. The area occupied by the insulation patch 200 is smaller than the area occupied by the circuit layer 110. The insulation patch 200 and the fine wirings 210 thereon constitute a fine wiring area, and one or two or more fine wiring areas may be provided with between the two chips 400 as needed, or one chip 400 may be electrically connected to two or more chips 400 at the same time by means of two or more fine wiring areas; and providing the fine wiring areas does not need to modify the original circuit layer 110, and the fine wiring areas are flexibly used and may be provided as needed to reduce the cost. The area occupied by the insulation patch 200 may refer to the area occupied by the insulation patch 200 on the substrate 100 and the area occupied by the circuit layer 110 on the substrate 100 when viewed from above in a top view.

The width of the fine wirings 210 refers to the side length of the cross section of the fine wirings 210 on the insulation patch 200. The width of the fine wirings 210 is smaller than the width of the wirings of the circuit layer 110, and the smaller the width of the fine wirings 210, the more connection points that can be obtained in the same space, which is conducive to improvement of the data transmission speed and bandwidth. In this embodiment, the width of the fine wirings 210 is from 0.1 micrometer to 2 micrometers, or from 1 micrometer to 5 micrometers, and may be selected as needed. Preferably, the width of the fine wirings 210 may be selected to be 0.1 µm, 0.2 µm, 0.5 µm, 0.7 µm, 1 µm, 1.2 µm, 1.5 µm, 1.7 µm, 2 µm, 2.5 µm, 3 µm, 3.5 µm, 4 µm, 4.5 micrometers, or 5 micrometers.

As shown in FIG. 5, a connection medium is provided with between each chip pin 410 and the respective fine pin 420. The connection medium includes an insulating medium 620 and at least one fine conductive path distributed in the insulating medium 620. The insulating medium 620 separates the respective chip 400 from the fine pin 420 in an insulating way to avoid interference, and the fine pins 420 are electrically connected with each other by means of the fine conductive paths. The form of each fine conductive path includes, but is not limited to, providing conductive particles or solder bumps in the insulating medium 620 to form a fine conductive path; the insulating medium 620 is provided with a fine conductive hole, and a conductive material layer is provided on an inner wall of the fine conductive hole to form a fine conductive path, for example, a through silicon via; conductive bumps are provided with on the fine pins 420 and/or the fine wirings 210, and the conductive bumps constitute a fine conductive path.

The integrated circuit packaging structure further includes an encapsulation layer, the encapsulation layer is not shown in the figures, wherein the chip 400, the fine wirings 210, and the insulation patch 200 are located between the encapsulation layer and the substrate 100, and the chips 400 and the insulation patch 200 on the substrate 100 is packaged by the encapsulation layer. The encapsulation layer can protect the chips 400, the insulation patch 200, and the fine wirings 210 from damage, reduce the influence and interference from external environmental factors on the performance of the chips to ensure the performance of the chips 400.

A heat sink is provided with on each chip 400. The use of the insulation patch may increase the difficulty of heat dissipation toward the substrate of the chip 400, the thermal impedance increases, as fine wirings of high speed and wide bandwidth are used for the communication between the chips 400, and the chip 400 has a high computing speed and heat generation as well, adding the heat sink to the chip 400 (on the side facing away from the substrate) facilitates the heat dissipation of the chip 400 from the heat sink on the back surface, with the heat dissipation not only relying on the heat dissipation channel from the substrate 100, so that the chip 400 can work normally at a higher computing speed. This structural design improves the data communication bandwidth and speed between the chips 400 on the one hand, and ensures that the chip 400 can work normally at a higher computing speed on the one hand, thereby greatly improving the overall computing performance of the system. The heat sink is also packaged on the substrate 100 by the encapsulation layer, and a top surface of the heat sink may be exposed out of the encapsulation layer to dissipate heat or may not be exposed.

Figure 7:
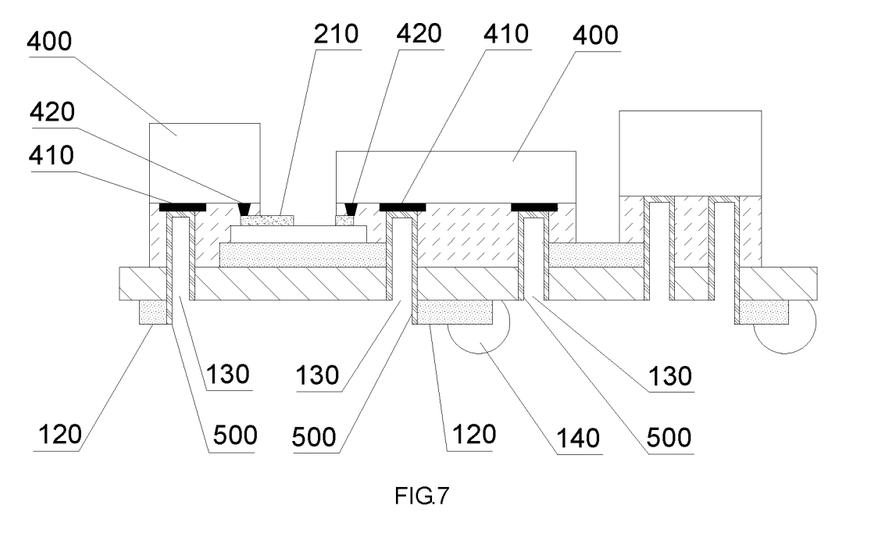
FIG. 7 is a second schematic diagram of an integrated circuit packaging structure according to an embodiment of the present disclosure.

As shown in FIG. 7, the substrate 100 is provided with connection through holes 130, wherein the connection through holes 130 are connected with the circuit pins, and a first opening of each connection through hole 130 is connected with the respective chip pin 410, and a second opening of the connection through hole 130 is an operation window, a conductive layer 500 is provided with in the connection through hole 130, and the conductive layer 500 electrically connects the chip pin 410 and the respective circuit pin. The circuit layer 110 is provided with circuits pin, and the circuit layer 110 may be formed on the substrate 100 in advance. Optionally, the circuit layer 110 may be formed on the substrate 100 when the integrated circuit is packaged. The circuit pins may be connection portions directly led out from the circuit layer 110, and may also be extension pins electrically connected to the connection portions, as long as electrically connection with the circuit layer 110 can be achieved by means of the circuit pins. The chips 400 are placed on the substrate 100, and the chips 400 may be fixed to the substrate 100 or may not be fixed. The chips 400 are provided opposite to the substrate 100, and the chips 400 are each provided with chip pin(s) 410 facing the substrate 100, wherein the chip pin(s) 410 of each chip 400 includes, but is not limited to, a connection portion led out from inside the chip 400 or an extension pin electrically connected to the connection portion, as long as electrical connection with the chip 400 can be achieved by means of the chip pins 410. Connection through holes 130 are formed on the substrate 100, each chip pin 410 is connected with the first opening of the respective connection through hole 130, and a conductive layer 500 is formed in the connection through hole 130 by means of the second opening of the connection through hole 130, wherein the conductive layer 500 electrically connects the chip pin 410 to the respective circuit pin; the chip pin(s) 410 is located on the top surface of the substrate 100, the chip 400 and the circuit layer 110 can be electrically connected from the bottom surface of the substrate 100 by means of the second opening of the connection through hole 130 to prevent the chip 400 from blocking the chip pin 410; wherein the connection through hole 130 is connected with the chip pin 410, and the circuit pin is at least partially located near the first opening of the connection through hole 130 or extends deep into the connection through hole 130, so that the conductive layer 500 can be electrically connected to the chip pin 410; the circuit pin is connected to the connection through hole 130, and the circuit pin is at least partially located near the first opening of the connection through hole 130, or near the second opening, or near the inner wall of the connection through hole 130, such that the conductive layer 500 can be electrically coupled to respective circuit pin; the chips 400 may be chips 400 or electronic devices (including but not limited to resistors, capacitors) or other electronic devices (including but not limited to antennas). The chips 400 may be fixed to the substrate 100 by the connection through holes 130 and the conductive layer 500. Optionally, the chips 400 may be fixed to the substrate 100 by other means (including, but not limited to, bonding, molding plastic packaging). In this way, the cost of packaging the integrated circuit can be reduced, and the packaging time can be saved. Further, the plurality of chips 400 can be simultaneously mounted on a large substrate of a very large area, and the batch processing on the large substrate further reduces the cost and saves the packaging time. Moreover, the overall thickness of the substrate 100 and the chip 400 is reduced, and even no gap is required to be reserved between the substrate 100 and the chips 400 (in principle, no gap is required to be reserved, but other materials may be provided with between the substrate 100 and the chip 400 as needed); the connection through holes 130 may be formed using a process that does not require heat welding, thereby avoiding damage to the mechanism and performance of the ultra-thin chips and flexible circuit boards caused by various thermo-mechanical stress distributions during high-temperature thermal cycling. This is very helpful for packaging processes using ultra-thin, flexible circuit boards. On the other hand, in the conventional package technology of wire bonding, wires are used to realize the electrical connection between the chips 400 and the circuit on the substrate 100, and the wires are to be avoided from each other, so that the space to be occupied is relatively large, and in the present disclosure, electrical connection between the chips and the additional circuit layers 120 is realized by forming the connecting the through holes 130 on the substrate 100, the conductive layers 500 is provided within the respective connection through hole 130 without occupying extra space, which can reduce the overall volume after the package, in particular, for ultra-thin circuit boards, their characteristics of being thin and light can be well maintained, for the flexible circuit boards, their flexibility can be well maintained.

Preferably, the method includes but is not limited to the following two methods:

(1) The circuit layer 110 is provided with circuit pins, the substrate 100 is provided with connection through holes 130, wherein the connection through holes 130 are connected with the circuit pins respectively; the chips 400 are placed on the top surface of the substrate 100, the chip pin(s) 410 of each chip 400 is connected with the first opening of the respective connection through hole 130; a conductive layer 500 in the connection through hole 130 by means of the second opening of the connection through hole 130, so that the conductive layer 500 electrically connects the chip pin 410 to the respective circuit pin; or (2), the circuit layer 110 is provided with circuit pins, the chips 400 are placed on the top surface of the substrate 100, the chip pin(s) 410 of each chip 400 is oriented toward the substrate 100, and the connection through holes 130 are formed on the substrate 100, the connection thorough holes 130 are connected with the circuit pins respectively, and the first opening of each connection through hole 130 is connected with the respective chip pin 410, the conductive layer 500 is formed in the connection through hole 130 by means of the second opening of the connection through hole 130, so that the conductive layer 500 electrically connects the chip pin 410 to the respective circuit pin.

In this embodiment, as shown in FIG. 7, the connection through holes 130 are also additional through holes and an additional circuit layer 120 is respectively provided on the bottom surface of the substrate 100 and inside the substrate 100, wherein the additional circuit layers 120 are each provided with additional pins, and the additional through holes (connection through hole 130) are connected with the additional pins respectively, and the first opening of each additional through hole (connection through hole 130) is connected with the respective chip pin 410, and the second opening of the additional through hole (connection through hole 130) is an operation window, and an additional conductive layer 500 is provided within the connection through hole (connection through hole 130), and the additional conductive layer 500 electrically connects the chip pin 410 and the respective additional pin. Moreover, an external port 140 is provided on the bottom surface of the substrate 100, wherein the external port 140 is electrically connected to at least one of the conductive layers 500. The external port 140 may be connected to other electronic devices to expand the function of the entire integrated circuit, and may also be used to be connected with a power supply, and the chip 400 are directly supplied by the power supply.

The substrate 100 may be a normal circuit board or a flexible circuit board, or the substrate 100 may include at least two layers of flexible circuit boards arranged in a stacked manner. The use of a multiple layers of circuit boards and the multiple layers of circuits therein can provide more possibilities of wiring and improve the using performance of the chip 400; the use of flexible and thin circuit boards reduces the overall weight, volume and thickness of the system. With proper system design and selection of encapsulation layer material, the system as a whole can still possess sufficient flexibility after package and integration and is applicable to wearable products. Moreover, by using the insulation patch 200, the thickness of the fine wirings 210 per se is very small, as long as the insulation patch 200 can satisfy the insulation between the fine wirings 210 and other regions of the substrate 100, and does not require a very large thickness, which facilitate the system as a whole to maintain its flexibility and thinness. The thickness of the fine wirings 210 refers to the side length of the cross section of the fine wirings 210 which is perpendicular to the insulation patch 200, and the thickness of the insulation patch 200 refers to the side length of the cross section of the insulation patch 200 which is perpendicular to the substrate 100. The thickness of the fine wirings 210 refers to the side length of the cross section of the fine wirings 210 which is perpendicular to the insulation patch 200, and the thickness of the insulation patch 200 refers to the side length of the cross section of the insulation patch 200 which is perpendicular to the substrate 100.

In this embodiment, the integrated circuit packaging method mainly includes: prearranging the circuit layer 110 on the substrate 100, prearranging the insulation patch 200 on the substrate 100, forming the fine wirings 210 on the insulation patch 200, providing at least two chips 400 on the substrate 100, wherein each chip 400 is provided with fine pin(s) 420 and chip pin(s) 410, the chip pin(s) 410 is electrically connected to the circuit layer 110, and the fine pin(s) 420 is electrically connected to the respective fine wiring 210, so that the at least two chips 400 are directly connected by means of the fine wirings 210.

When the connection is implemented by means of the connection through holes 130, the method further includes steps of: prearranged circuit pins on the circuit layer 110, prearranging connection through holes on the substrate 100 with 130, connecting the connection through holes 130 with the circuit pins respectively; placing the chips 400 on the top surface of the substrate 100, connecting the chip pin(s) 410 of each chip 400 to the first opening of the respective connection through hole 130; and forming the conductive layer 500 in the connection through holes 130 by means of the second opening of the connection through hole 130, so that the conductive layer 500 electrically connect the chip pin 410 to the respective circuit pin; or providing the circuit layer 110 is with circuit pins, placing the chips 400 on the top surface of the substrate 100 such that the chip pin(s) 410 of each chip 400 faces the substrate 100, forming the connection through holes 130 on the substrate 100, connecting the connection through holes 130 with the circuit pins respectively, connecting the first opening of each connection through hole 130 with the respective chip pin 410, and forming the conductive layer 500 in the connection through hole 130 by means of the second opening of the connection through hole 130 so that the conductive layer 500 electrically connects the chip pin 410 to the respective circuit pin.

When the connection is implemented by means of additional through hole holes, the method further includes steps of: prearranging an additional circuit layer 120 on the bottom surface of the substrate 100 and/or inside the substrate 100, wherein additional pins are prearranged on the additional circuit layer 120, and the substrate 100 is provided with additional thorough holes, wherein the additional through holes are connected with the additional pins respectively; placing the chips 400 on the top surface of the substrate 100, connecting the chip pin(s) 410 of each chip 400 with the first opening of the respective additional through hole; forming an additional conductive layer 500 in the additional through hole by means of the second opening of the additional through hole, so that the additional conductive layer 500 electrically connects the chip pin 410 to the respective additional pin; or prearranging additional pins on the additional circuit layer 120, placing the chips 400 on the top surface of the substrate 100, with the chip pin(s) 410 of each chip 400 oriented toward the substrate 100, forming the additional through holes on the substrate 100, connecting the additional through holes with the additional pins respectively, connecting the first openings of each additional through hole with the respective chip pin 410, and forming the conductive layer 500 in the additional through hole by means of the second opening of the additional through hole, so that the conductive layer 500 electrically connects the chip pin 410 to the respective circuit pin.

The integrated circuit packaging method further includes packaging the chips 400: providing an encapsulation layer on the substrate 100, wherein the chips 400, the insulation patch 200, and the fine wirings 210 are located between the encapsulation layer and the substrate 100, and the encapsulation layer packages the chips 400, the insulation patch 200, and the fine wirings 210. After the package, the whole system composed of the substrate 100, the chips 400, the encapsulation layer, the insulation patch 200, the fine wirings 210, and the like is cut into a plurality of small system units according to preset parameters such as functions, sizes, so that the chips 400 are mounted and packaged on the substrate 100 simultaneously, and then cut into system units of suitable sizes, which can greatly improve production efficiency and reduce cost.

Embodiment 2

The difference between Embodiment 2 and Embodiment 1 is:

As shown in FIG. 1 to FIG. 5, the circuit layer 110 is not prearranged on the substrate 100, and the circuit layer 110 is formed when the fine wirings 210 are formed, the specific manufacturing method is as follows: providing a conductor layer 101 and an additional conductor layer 102 on the substrate 100, providing an insulation patch 200 on the conductor layer 101, and providing a conductor film 201 on the insulation patch 200, wherein a thickness of the conductor layer 101 is much larger than a thickness of the conductor film 201, and a resist 300 is provided on the conductor layer 101, the additional conductor layer 102, and the conductor film 201, a wiring pattern is provided with in the resist 300, the conductor layer 101 is etched into the circuit layer 110 by chemical etching according to the wiring pattern, and the conductor film 201 is etched into the fine wirings 210. After the resist 300 is provided on the conductor layer 101, the additional conductor layer 102, and the conductor film 201, chemical etching may be simultaneously performed, and the circuit layer 110, the additional circuit layer 120, and the fine wirings 210 are simultaneously formed in accordance with the wiring pattern, thereby the steps are saved, the efficiency is improved, and the production cost is reduced. All the circuit layers 110, additional conductor layers 102, and conductor films 201 on multiple substrates 100 may be simultaneously processed, which is advantageous for mass production and further reduces the cost. Further, the thickness of the conductor film 201 is equivalent to the thickness of the fine wirings 210, and the thickness of the conductor layer 101 is equivalent to the thickness of the circuit layer 110, for example, when the thickness of the fine wirings 210 is much smaller than the thickness of the circuit layer 110, the thickness of the conductor film 201 needs to be much smaller than the thickness of the conductor layer 101.

Embodiment 3

The difference between Embodiment 3 and Embodiment 1 is:

The insulation patch 200 and the fine wirings 210 are formed by: prearranging a circuit layer 110 on the substrate 100, providing an insulation patch 200 on the circuit layer 110, and providing a photoresist on the insulation patch 200, wherein wiring grooves are formed in the wiring grooves and conductor films are grown in the wiring grooves and on the surface of the photoresist, thereby the fine wirings 210 are formed in the wiring groove after the photoresist is removed.

Embodiment 4

The difference between Embodiment 4 and Embodiment 1 is:

The insulation patch 200 and the fine wirings 210 are formed by: forming a removable (peelable) layer and an insulation patch 200 on a carrier, forming fine wirings 210 on the insulation patch 200, transferring the insulation patch 200 together with the fine wirings 210 to the substrate 100, and fixing the fine wirings 210 to the substrate 100. For example, the insulation patch 200 and the fine wirings 210 may be flipped onto another carrier, and the other carrier flips the insulation patch 200 and the fine wirings 210 onto the substrate again, so that the fine wirings 210 faces upward, and the fine wirings 210 together with the insulation patch 200 therebelow are fixed to the substrate 100.

Embodiment 5

Figure 6:
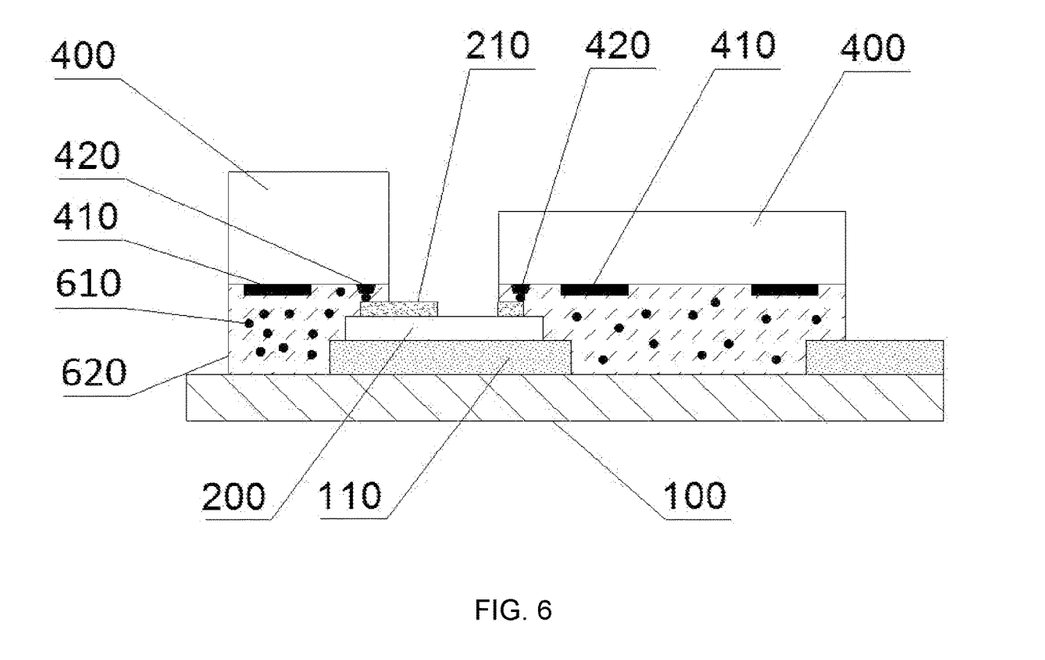
FIG. 6 is a first schematic diagram of an integrated circuit packaging structure according to an embodiment of the present disclosure.

The difference between Embodiment 5 and Embodiment 1 is:

As shown in FIG. 6, the fine pins 420 are electrically connected with the fine wirings 210 by: providing a connection medium between the chips 400 and the fine pins 420, wherein the connection medium includes an insulating medium 620 and at least one fine conductive particle 610 distributed in the insulating medium 620, the fine conductive particles 610 are insulated from each other by the insulating medium 620, and a spacing between each chip pin 410 and the respective fine pin(s) 420 is less than or equal to the height of the fine conductive particles 610, and the spacing between the fine pin 420 on each chip 400 and the respective fine wiring 210 on the insulation patch 200 is small, thus the fine conductive particles 610 are distributed at a high density, placing the chip 400 on the substrate 100, electrically connecting one end of each fine conductive particle 610 to the respective fine pin 420, and electrically connecting the other end of the fine conductive particle to the fine wiring 210 to form at least one conductive path formed by the fine conductive particles 610; a spacing between the chip pin 410 and the circuit layer 110 is greater than the height of the fine conductive particles 610, and when the spacing between the chip pin 410 and the circuit layer 110 is large, the fine conductive particles 610 are distributed at a low density, thus the chip pin 410 and the circuit layer 110 cannot be electrically connected by means of the conductive particles, and any conductive path formed by the fine conductive particles 610 cannot be formed, thereby electrical isolation between the chip pin 410 and the circuit layer 110 is maintained. The insulating medium 620 is provided between each chip 400 and the respective fine pin 420, and the chip 400 is pushed toward the insulation patch 200 to reach a preset position, since a spacing between the chip pin 410 and the respective fine pin 420 is less than or equal to the height of fine conductive particles 610, the fine conductive particles 610 are squeezed, one end thereof is electrically connected to the fine pin 420, and the other end thereof is electrically connected to the fine respective wiring 210, thereby electrically connecting the fine pin 420 and the fine wiring 210; the spacing between the chip pin 410 and the circuit layers 110 is greater than the height of the fine conductive particles 610, and the fine conductive particles 610 between the chip pin 410 and the circuit layer 110 cannot simultaneously contact the chip pin 410 and the fine wiring 210, so the fine conductive particles 610 cannot electrically connect the chip pin 410 and the fine wiring 210. In this connection manner, the electrical connection between the fine pins 420 and the fine wirings 210 is realized in the process of placing the chips 400 on the insulation patch 200, thus the processes are simple with high efficiency.

The technical features of the above embodiments may be combined at will. For the sake of brevity of description, all possible combinations of the technical features in the above embodiments are not described. However, as long as there is no contradiction in the combination of these technical features, it is considered as fallen with the range described in this specification.

The above embodiments are merely illustrative of several embodiments of the present disclosure, and the description thereof is more specific and detailed, but is not to be construed as limiting the scope of the present disclosure. It should be noted that various variations and modifications may be made by those ordinarily skilled in the art without departing from the conception of the present disclosure and they shall all be considered as fallen within the protection scope of the present disclosure. Therefore, the protection scope of the present disclosure should be determined by the appended claims.

What is claimed is:

1. An integrated circuit packaging method, comprising:
   making a substrate provided with a circuit layer, providing an insulation patch on the substrate, forming fine wirings on the insulation patch, providing at least two of the chips on the substrate, wherein each chip is provided with fine pin(s) and chip pin(s), electrically connecting the chip(s) pin with the circuit layer, electrically connecting the fine pin(s) with the respective fine wiring such that the at least two chips are directly connected by means of the fine wirings,
   wherein a connection medium is provided between the chips and the fine wirings, the connection medium includes an insulating medium and at least one fine conductive particle distributed within the insulating medium, a spacing between each chip pin and the respective fine pin is less than or equal to a height of the fine conductive particle(s), one end of each fine conductive particle is electrically connected to the respective fine pin, the other end of the fine conductive particle is electrically connected to the respective fine wiring, a spacing between each chip pin and the respective fine wiring is greater than the height of the fine conductive particles, and the chip pin(s) and the fine wiring are not electrically connected by the conductive particle(s).

2. The integrated circuit packaging method according to claim 1, comprising:
   making the circuit layer provided with circuit pins and the substrate provided with connection through holes, connecting the connection through holes with the circuit pins respectively, placing chips on a top surface of the substrate, connecting the chip pin(s) of each chip with a first opening of the respective connection through hole, forming a conductive layer in the connection through hole by means of the second opening of the connection through hole, such that the conductive layer electrically connects the chip pin(s) with the respective circuit pins; or
   making the circuit layer provided with circuit pins, placing chips on the top surface of the substrate with the chip pin(s) of each chip facing the substrate, forming connection through holes on the substrate, connecting the connection through holes with the circuit pins respectively, connecting the first opening of each connection through hole with the respective chip pin, forming a conductive layer in the connection through hole by means of the second opening of the connection through hole, such that the conductive layer electrically connects the chip pin(s) to the respective circuit pin.

3. The integrated circuit packaging method according to claim 1, comprising:
   providing an additional circuit layer on a bottom surface of the substrate and/or inside the substrate, wherein the additional circuit layer is provided with additional pins, and the substrate is provided with additional through holes, connecting the additional through holes with the additional pins respectively, placing the chips on the top surface of the substrate, connecting the chip pin(s) of each chip with the first opening of the respective additional through hole, and forming an additional conductive layer in the additional through hole by means of the second opening of the additional through hole, such that the additional conductive layer electrically connects the chip pin(s) to the respective additional pin; or
   providing the additional circuit layer with additional pins, placing the chips on the top surface of the substrate, with the chip pin(s) of each chip facing the substrate, forming additional through holes on the substrate, connecting the additional through holes with the additional pins respectively, connecting the first opening of each additional through hole with the respective chip pin, and forming a conductive layer in the additional through hole by means of the second opening of the additional through hole such that the conductive layer electrically connects the chip pin with the respective circuit pin.

4. The integrated circuit packaging method according to claim 1, further comprising: providing an encapsulation layer on the substrate, wherein the chips, the insulation patch, and the fine pins are located between the encapsulation layer and the substrate, and the chips, the insulation patch, and the fine pins are encapsulated and packaged by the encapsulation layer.

5. The integrated circuit packaging method according to claim 1, wherein a conductor layer is provided on the substrate, the insulation patch is provided on the conductor layer, a conductor film is provided on the insulation patch, a thickness of the conductor layer is greater than a thickness of the conductor film, the resist(s) is provided on the conductor layer and the conductor film, the resist(s) is provided with a wiring pattern, the conductor layer is etched into the circuit layer by a chemical etching method in accordance with the wiring pattern, and the conductor film is etched into the fine wirings.

6. The integrated circuit packaging method according to claim 1, wherein the circuit layer is provided with on the substrate, the insulation patch is provided on the circuit layer, a photoresist is provided on the insulation patch, wiring grooves are formed in the photoresist, a conductor film is formed in the wiring grooves and on the surface of the photoresist by crystal growth, and the photoresist is removed to form the fine wirings in the wiring grooves.

7. The integrated circuit packaging method according to claim 1, wherein the insulation patch is formed on a carrier, the fine wirings are formed on the insulation patch, the insulation patch along with the fine wirings are transferred to the substrate, and the fine wirings are fixed to the substrate.

\* \* \* \* \*